United States Patent
Brahmadathan

(10) Patent No.: US 9,811,273 B1
(45) Date of Patent: Nov. 7, 2017

(54) SYSTEM AND METHOD FOR RELIABLE HIGH-SPEED DATA TRANSFER IN MULTIPLE DATA RATE NONVOLATILE MEMORY

(71) Applicant: CADENCE DESIGN SYSTEMS, INC., San Jose, CA (US)

(72) Inventor: Sandeep Brahmadathan, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 296 days.

(21) Appl. No.: 14/580,833

(22) Filed: Dec. 23, 2014

(51) Int. Cl.
  G11C 29/00 (2006.01)
  G06F 3/06 (2006.01)
  G06F 11/10 (2006.01)
  G11C 29/52 (2006.01)

(52) U.S. Cl.
  CPC .......... G06F 3/0619 (2013.01); G06F 3/0655 (2013.01); G06F 3/0679 (2013.01); G06F 11/1068 (2013.01); G11C 29/52 (2013.01); G06F 2206/1014 (2013.01)

(58) Field of Classification Search
  CPC ............. G06F 11/1008; G06F 11/1076; G06F 11/1068; G06F 11/1044; G06F 3/0619; G06F 3/0655; G06F 3/0679; G06F 2206/1014; G11C 7/1006; G11C 29/52
  USPC ................................................ 714/763, 764
  See application file for complete search history.

(56) References Cited

U.S. PATENT DOCUMENTS

| | | | | |
|---|---|---|---|---|
| 6,292,903 | B1* | 9/2001 | Coteus | G06F 13/1689 713/401 |
| 6,339,555 | B1* | 1/2002 | Hamada | G11C 7/1066 365/194 |
| 6,529,993 | B1* | 3/2003 | Rogers | G11C 7/1051 365/189.02 |
| 7,345,933 | B1* | 3/2008 | Telem | G06F 13/28 327/141 |
| 2001/0014922 | A1* | 8/2001 | Kuge | G06F 13/1689 710/36 |
| 2003/0005346 | A1* | 1/2003 | Zumkehr | G06F 13/1689 713/401 |
| 2003/0154416 | A1* | 8/2003 | LaBerge | G06F 13/1689 713/400 |
| 2010/0005281 | A1* | 1/2010 | Buchmann | G06F 13/4243 713/2 |
| 2010/0091537 | A1* | 4/2010 | Best | G11C 5/02 365/51 |
| 2010/0205354 | A1* | 8/2010 | Suzuki | G06F 12/0246 711/103 |
| 2010/0205386 | A1* | 8/2010 | Yamashita | G06F 13/1689 711/154 |

* cited by examiner

Primary Examiner — Albert Decady
Assistant Examiner — Osman M Alshack
(74) Attorney, Agent, or Firm — Rosenberg, Klein & Lee

(57) ABSTRACT

The subject system and method are generally directed to ensuring reliable high speed data transfer in multiple data rate nonvolatile memory, such as double data rate (DDR) nonvolatile NAND flash memory and the like. The system and method provide measures to achieve read and write training for data signals (DQ) and the data strobe signal (DQS), one relative to the other. In such manner, high speed data transfers to and from nonvolatile memory such as flash devices may be performed with a reduced risk of data loss even at high operational frequencies.

15 Claims, 13 Drawing Sheets

SYSTEM AND METHOD FOR RELIABLE HIGH-SPEED DATA TRANSFER IN MULTIPLE DATA RATE NONVOLATILE MEMORY

BACKGROUND OF THE INVENTION

The subject system and method are generally directed to ensuring reliable high speed data transfer in multiple data rate nonvolatile memory, such as double data rate (DDR) nonvolatile NAND flash memory and the like. The system and method generally provide measures to achieve expedited central-alignment of data (DQ) and data strobe signals (DQS) one relative to the other. In such manner, high speed data transfers to and from error-prone nonvolatile memory such as flash devices may be performed with a reduced risk of data loss.

While various approaches to training random access memory (RAM) to effectively communicate in reliable manner at high speeds are known in the art, no suitable prior art approach presently exists for nonvolatile memory (NVM) systems that account for their unique characteristic restrictions. As electronic device speeds and component density in devices increase and as timing tolerances become smaller, the need for precise training and synchronization between data strobe and data signals in nonvolatile memory and their memory controllers are only exacerbated.

There is therefore a need for a system and method for reliable high speed data transfer with multiple data rate nonvolatile memory. There is a need for training and alignment of data and data strobe signals between memory controllers and corresponding nonvolatile memory. More particularly, there is a need for optimized and expedited alignment of timing signals between a double data rate (DDR) interface memory controller and nonvolatile memory devices.

SUMMARY OF THE INVENTION

A method for reliable high speed data transfer in multiple data rate nonvolatile memory is disclosed. The method includes establishing a range of delay values between a plurality of data signals relative a data strobe signal for data transmission from a memory controller to a nonvolatile memory. The method also includes selectively establishing a training portion in the nonvolatile memory as a function of at least a smallest erasable portion of the nonvolatile memory. Further, the method includes providing at least one known data pattern, and executing the memory controller to sequentially write the known data pattern to at least sector portions of the training portion of the nonvolatile memory. Each sector portion of the training portion is written at a different delay value within the range of delay values and all of the delay values of the range of delay values are associated with a corresponding one of the written sector portions. The memory controller is further executed to sequentially read the sector portions and compare the data pattern read with the known data pattern to determine delay values corresponding to leading and trailing edge alignment between the data signals and the data strobe signal between which matching data is read. Still further, the memory controller is executed to establish an optimal delay value as a mean between the delay values of the leading and trailing edge alignment.

From another aspect, a method for reliable high speed data transfer in multiple data rate nonvolatile memory is disclosed. The method includes selectively establishing a training portion in a nonvolatile memory as a function of at least a smallest erasable portion of the nonvolatile memory. The method further includes providing a known data pattern, and storing the known data pattern that is written into the training portion of the nonvolatile memory at a first data rate. The method also includes repetitively reading the stored data pattern from the training portion of the nonvolatile memory as a plurality of data signals in conjunction with a data strobe signal at sequentially different delay values of the data strobe signal relative to the data signals. The reading is carried out at a second data rate, wherein the second data rate is greater than the first data rate. Further, the method includes sequentially comparing the data pattern read from the training portion with the known data pattern, and responsive to the sequential comparisons, determining an optimum delay value that positions rising and falling edges of the data strobe signal in alignment with portions centrally disposed with respect to rising and falling edges of the data signals. The optimum delay is used for subsequent read operations from the nonvolatile memory at the second data rate.

From yet another aspect, a system for reliable high speed data transfer in multiple data rate nonvolatile memory is disclosed. The system includes a memory controller having a timing generator establishing a data strobe signal output during write operations and a plurality of delay circuits operable to selectively delay a received data strobe signal and a plurality of data signals output from the memory controller. The system further includes a nonvolatile memory coupled to the memory controller by a data strobe signal line and a plurality of data signal lines for bidirectional transmission therebetween. The memory controller has a training module that is configured to establish a range of delay values for respective use with the plurality of delay circuits to selectively delay the data strobe signal relative to data signals during a read training process. The training module is also configured to write a first known data pattern into a page of a training portion of the nonvolatile memory in a low speed mode, and repeatedly read the page in a high speed mode and sequentially incrementing a delay value within the range of delay values for each successive read operation to thereby sweep a delay of the data strobe signal through at least a portion of the range of delay values. Further, the training module is configured to compare the first known data pattern with data read during each successive read operation to determine relative leading and trailing edge alignment of the data strobe signal with respect to the data signals. The training module is further configured to determine an optimum read delay value of the data strobe signal relative to the data signals as a mean delay value between the delay values of the leading and trailing edge alignment.

The training module is further configured to repeatedly write a second known data pattern to sequential sectors of the training portion in a high speed mode and with each write operation sequentially incrementing a delay value of data signals output from the memory controller relative to the data strobe signal output therefrom within the range of delay values for each successive write operation to thereby sweep the range of delay values. Still further, the training module is configured to sequentially read the sectors in a high speed mode using the optimum read delay value for the data strobe signal output from the nonvolatile memory and compare the second known data pattern with data read during each successive read operation to determine relative leading and trailing edge alignment of the data signals with respect to the data strobe signal. The training module is still further configured to determine an optimum write delay value of the data signals relative to the data strobe signal as a mean delay value between the delay values of the leading and trailing edge alignment.

Additional aspects and details will be set forth in the description which follows and, in part, will be apparent from the description of the Figures.

DESCRIPTION OF THE PREFERRED EMBODIMENTS

Presently, no suitable method or system for alignment of intra-clock cycle timing parameters exists for nonvolatile solid state memory systems. Thus, system designers must very carefully ensure that timing skew between and amongst data signal lines (DQ) and data strobe lines (DQS) are precisely accounted for. To accommodate this precise requirement, a number of constraints must be considered when placing and routing a circuit design. Different etch-lengths, parasitics, and other issues limit designers' options in establishing a circuit design. Moreover, once a design is finalized and a fabricated device results, the device is unable to suitably adapt to changing skew between the DQ and DQS lines through different process, voltage, and temperature (PVT) operational conditions. As clock rates increase, the timing tolerances and margins shrink, which only further exacerbates the problem. Further, the greater the number of nonvolatile memory chips that are coupled to a controller, the higher the loading; which only further serves to strain already tight timing margins.

Thus, a system and method for adaptively adjusting the timing skew between data signal lines and data strobe lines during a periodic (or simulated) training is provided. The system and method serve to expeditiously determine an optimal (or suitable) delay value (or range) to selectively delay at least one of the data signals (DQ) or data strobe signals (DQS) to give ample timing margin and tolerance to ensure reliable data transfer and capture—even at the steadily-increasing clock-rates expected in the future, while accounting for various asymmetric routing and placement configurations.

Figure 1:
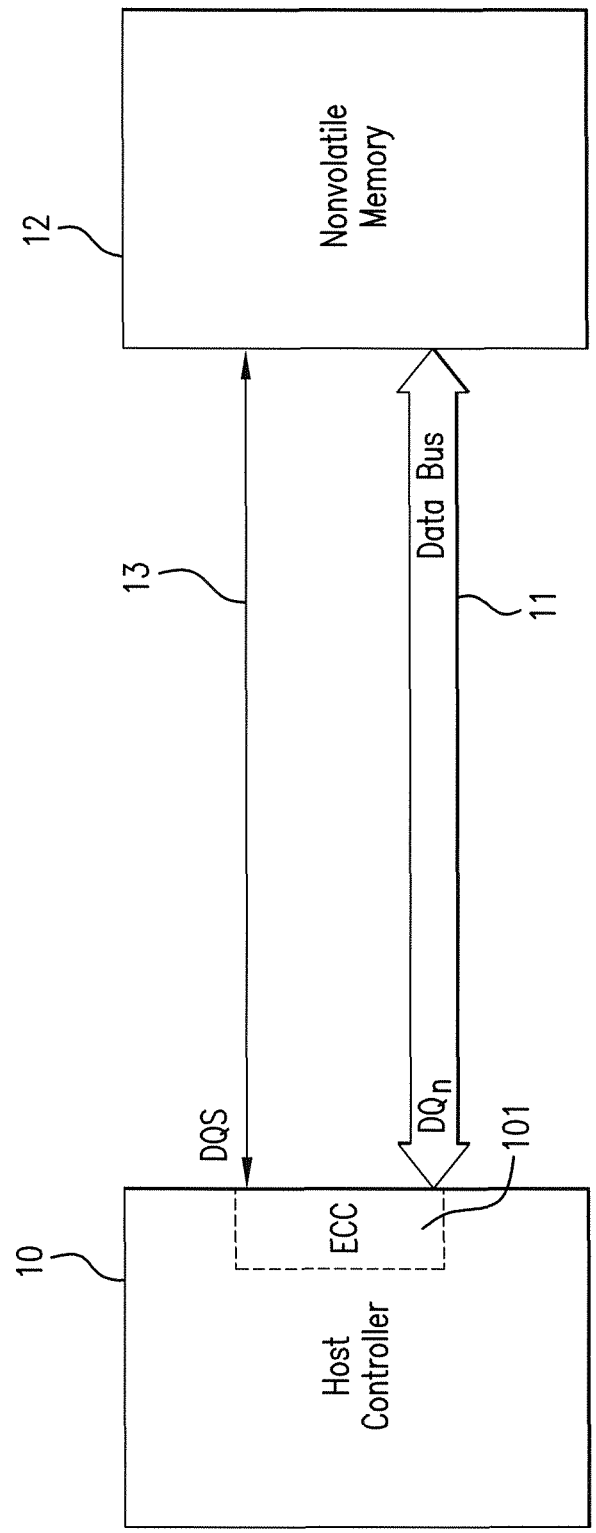
FIG. 1 is a block diagram of a nonvolatile memory system with an optional Error Correcting Codec (ECC) portion.

Referring to FIG. 1, there is shown a host controller 10 for effecting storage and retrieval operations in cooperation with a nonvolatile memory 12. As will be described in following paragraphs, the host controller 10 employs a number of different interconnections with nonvolatile memory 12, such as a number of data transmission lines which together form the data bus 11 for transmission of the data signals ($DQ_n$) and at least one data strobe line 13 for transmission of the data strobe signal (DQS). The number of data transmission lines of bus 11 and data strobe lines 13 may vary for the application. For simplicity, additional lines such as lines to specify the data transmission speed, operational mode, and other such functions are not shown, but would be known to those skilled in the art. Host controller 10 employs the data strobe signal on line 13 to synchronize transfer of data along the data transmission bus 11. During a writing operation, the data strobe signal on line 13 signals to the nonvolatile memory 12 that data is available for capture on one or more of the data lines of bus 11 for storage into the nonvolatile memory 12. During a reading operation, the data strobe signal on line 13 signals to the memory controller 10 that data is available for capture on one or more of the data lines of the data bus 11 from the nonvolatile memory 12. Host controller 10 may optionally include Error Correction Code (ECC) logic 101 for encoding data written to the nonvolatile memory 12 and correcting bit errors of data read therefrom.

Figure 2:
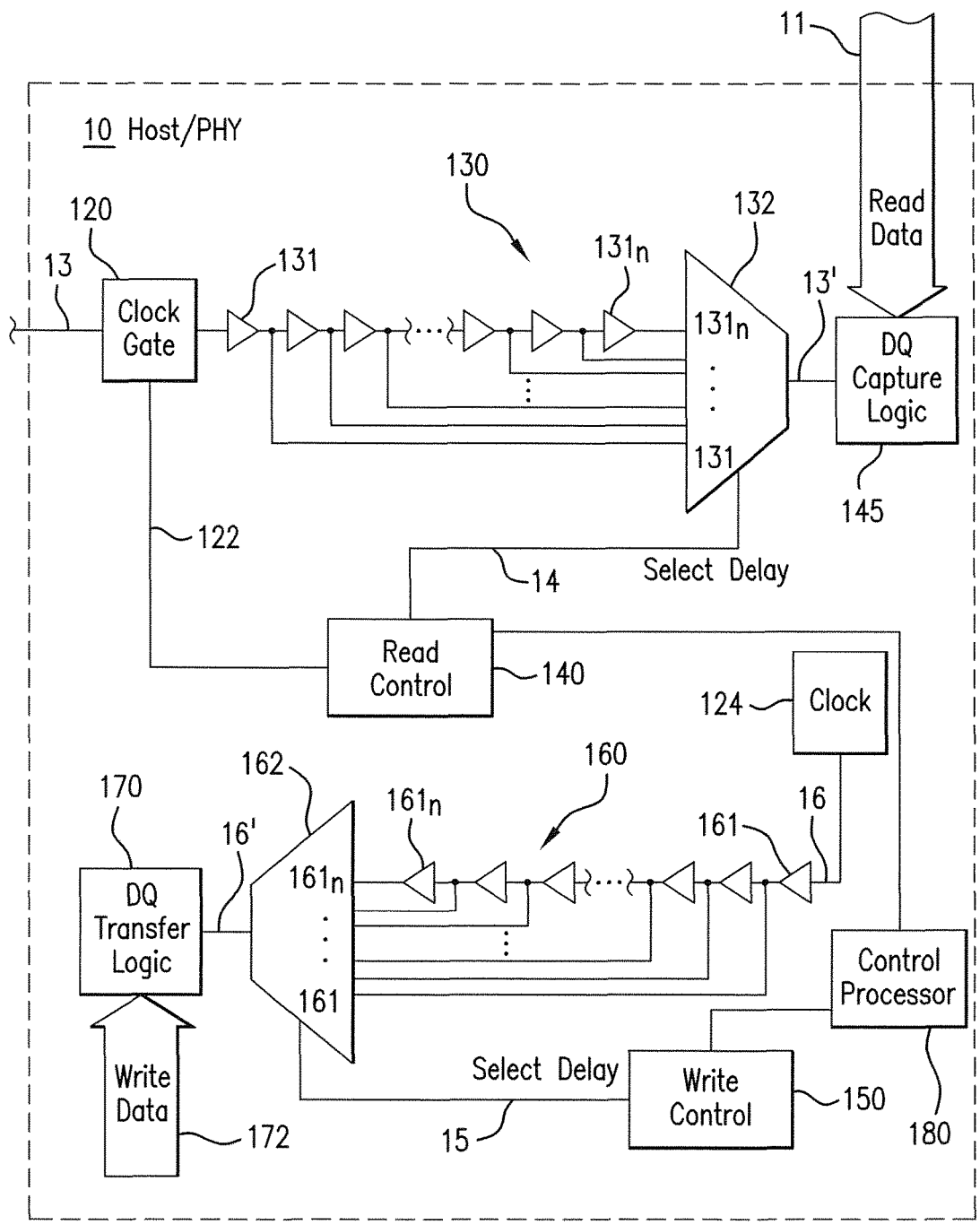
FIG. 2 is a block diagram of a high speed nonvolatile memory device and memory controller with an exemplary delay circuits.

As seen in FIG. 2, the host controller 10 (also called a memory controller, or physical access (PHY); the terms being used interchangeably herein) contains a control processor 180 that controls the read and write training process, as well as the read and write functions of the PHY 10. The PHY 10 includes a selective delay circuit 130 which may employ a plurality of buffer, gates or other logic devices 131 . . . $131_n$ as a delay line to delay the DQS signal and a selective delay circuit 160 which may employ a plurality of buffer, gates or other logic devices 161 . . . $161_n$ as a delay line to delay the data signals DQ. The delay circuit 130 includes a tap selection circuit 132, which may, for example, be implemented by a multiplexer, or other suitable circuit, to selectively tap the delay line formed by the plurality of serially arranged logic devices 131-$131_n$. In such manner, the DQS data strobe input on line 13 is gated into the selective delay circuit 130 by clock gate 120 responsive to an enable signal output on line 122 by the read control circuit 140 that is coupled to the control processor 180 and controlled thereby. Responsive to a delay select signal output from the read control circuit 140 on line 14, the tap selection circuit 132 outputs a DQS signal on line 13', delayed by the selected value, to the DQ capture logic circuit 145, for transferring the read data from nonvolatile memory 12 on data bus 11 to an internal bus (not shown in this diagram for simplicity).

The delay circuit 160 similarly includes a tap selection circuit 162, which may, for example, be implemented by a multiplexer, or other suitable circuit, to selectively tap the delay line formed by the plurality of serially arranged logic devices 161-$161_n$. Accordingly, a clock signal on line 16 from the clock 124 is input to the selective delay circuit 160. Responsive to a delay select signal output from the write control circuit 150 on line 15, under the control of control processor 180 coupled thereto, the tap selection circuit 162 outputs a delayed DQ clock signal on line 16' to the DQ transfer logic circuit 170 for transmission of the write data on the internal bus 172 to the nonvolatile memory 12, via the data bus 11 (not shown in this diagram for simplicity). By that arrangement, the memory controller 10 can selectively delay the data strobe signal on line 13 and the data signals on bus 11. While the exemplary circuit shown provides delay of the DQS signal for read operations and delay of the DQ signals for write operations, that arrangement can be interchanged or one or the other chosen for both reading and writing operations.

A delay select line 14 in the memory controller 10 is used in the tap selection circuit 132 of the selective delay circuit 130 to select the amount of delay by, in the exemplary circuit, choosing an input in the multiplexer from buffer outputs $131$-$131_n$. In such manner for the exemplary circuit shown in the figure, responsive to the selection signal 14, the selective signal delay circuit 130 passes the data strobe signal input on line 13 at a selected delay to be output from the delay circuit 130 as delayed strobe signal on line 13' input to the DQ capture logic 145 to capture the data output from nonvolatile memory 12 on the data bus 11. Likewise, a delay select line 15 in the memory controller 10 is used in the tap selection circuit 162 of the selective delay circuit 160 to select the amount of delay by, in the exemplary circuit, choosing an input in the multiplexer from buffer outputs $161$-$161_n$. In such manner for the exemplary circuit shown in the figure, responsive to the selection signal 15, the selective signal delay circuit 160 passes the clock signal input on line 16 at a selected delay to be output from the delay circuit 160 as delayed clock signal on line 16' input to the DQ transfer logic 170 to output the data signals on the data bus 11 to the nonvolatile memory 12.

Figure 4A:
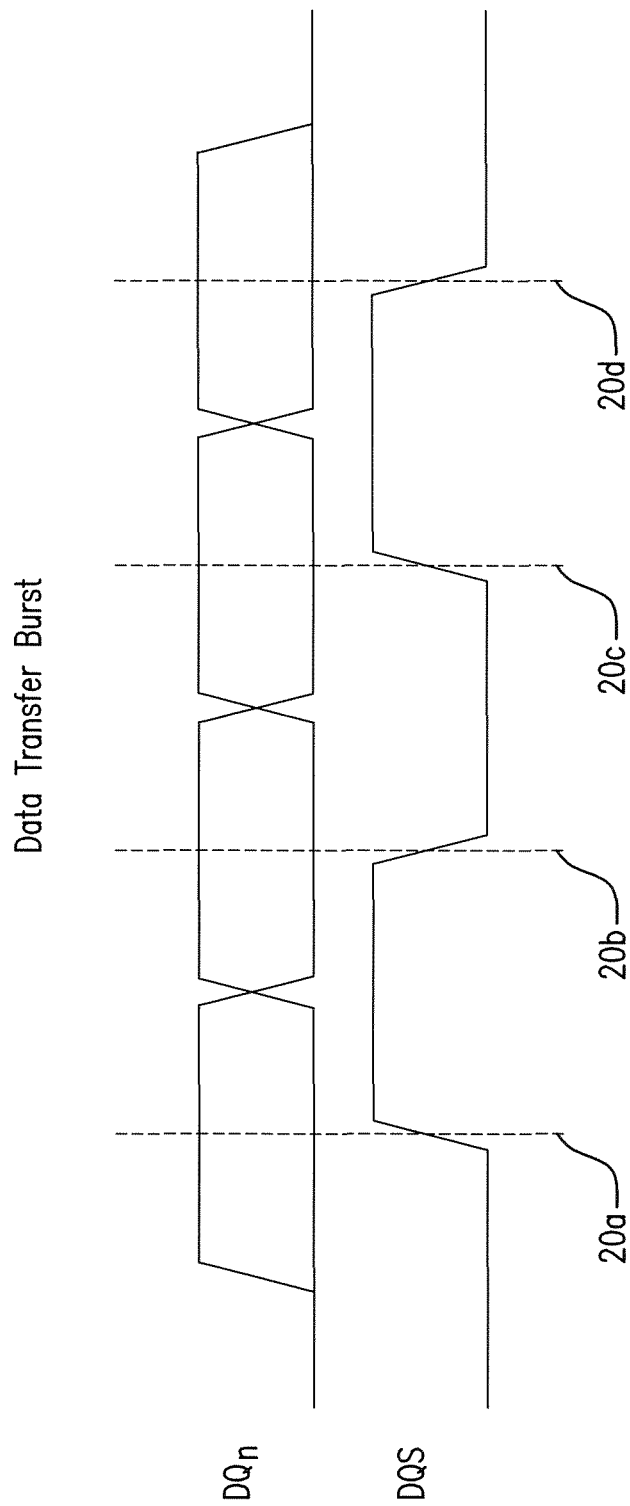
FIG. 4A is a timing diagram illustrating an example of central-alignment between source synchronous transmitted strobe and data transmission signals.

FIG. 4A shows an optimized central-alignment of the data strobe signal DQS to an exemplary data signals $DQ_n$. The data strobe rising and falling edges 20a, 20c and 20b, 20d, respectively, are centrally aligned with respect to the data signals $DQ_n$, appearing above. In such manner, operational timing tolerances and margins are maximized such that the effects of skews, aberrations, and other timing issues are necessarily minimized. Thereby, the memory controller and nonvolatile memory are able to effectively and reliably communicate even at high transmission speeds. As seen in FIG. 4A, multiple data rates such as a double date rate (DDR) or quadruple data rate (QDR) may be employed where multiple data bits are keyed for each strobe signal. In the example seen in FIG. 4A, a double data rate (DDR) scheme is shown where the data transmission is keyed at a double rate, at both the rising and falling edge of the data strobe signal.

Figure 4B:
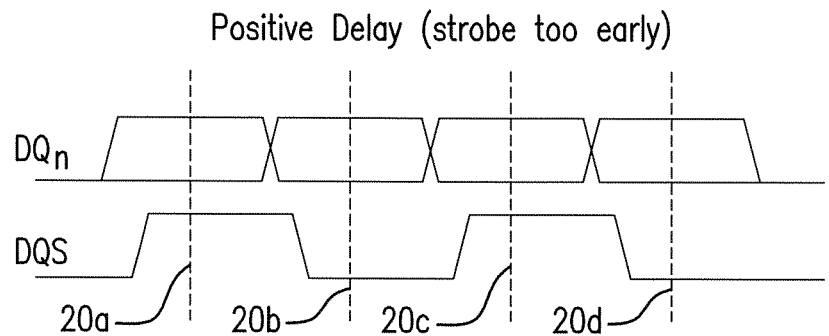
FIGS. 4B-4D are sets of timing diagrams comparatively illustrating examples of skewed time alignments as delay values are swept between source synchronously transmitted strobe and data signals.
Figure 4C:
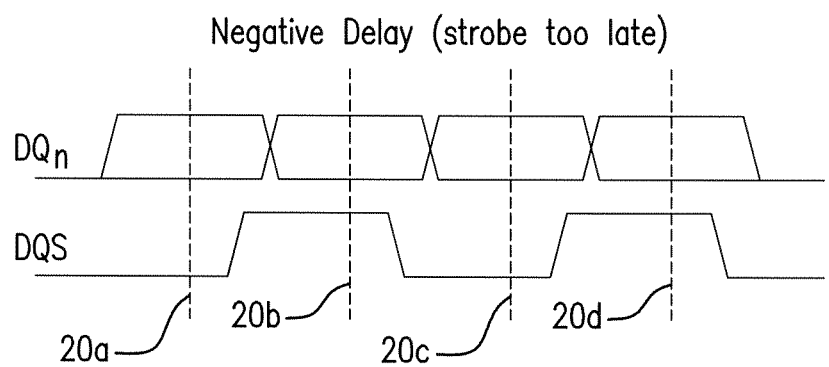
Figure 4D:
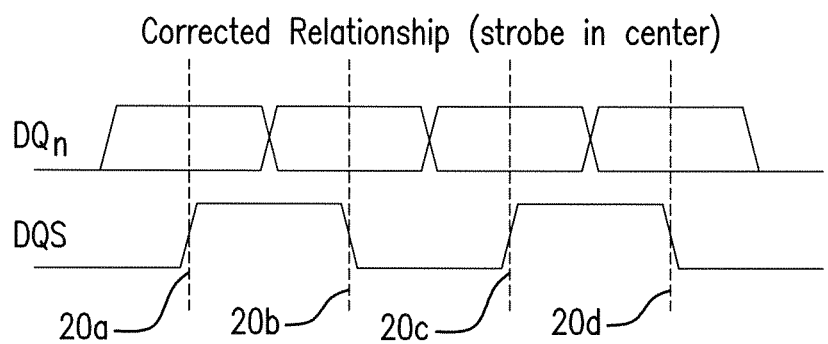

As seen in FIGS. 4B-4D, the sub-optimal alignments of the relative timings of the data signal (DQ) and the data strobe (DQS) are seen. A positive delay where the strobe signal is too early with respect to the data signals (FIG. 4B), a negative delay where the strobe signal is too late with respect to the data signals (FIG. 4C), and the optimal corrected relationship with the centrally aligned strobe signal with respect to the data signals (FIG. 4D), are shown. In situations other than the optimally configured delay between the data strobe and the data signals, the possibility exists that transmitted data may be not be captured (or only partially captured) by a receiving cache, register, flip-flop, or the like in either the memory controller or the nonvolatile memory.

In order to determine the optimal delay, a training module of a memory controller, for example, carries out a training procedure. During training, the relative delay between the strobe and data signals will be swept through the range of available selectable delay values provided by the previously described delay circuit 130.

Figure 5A:
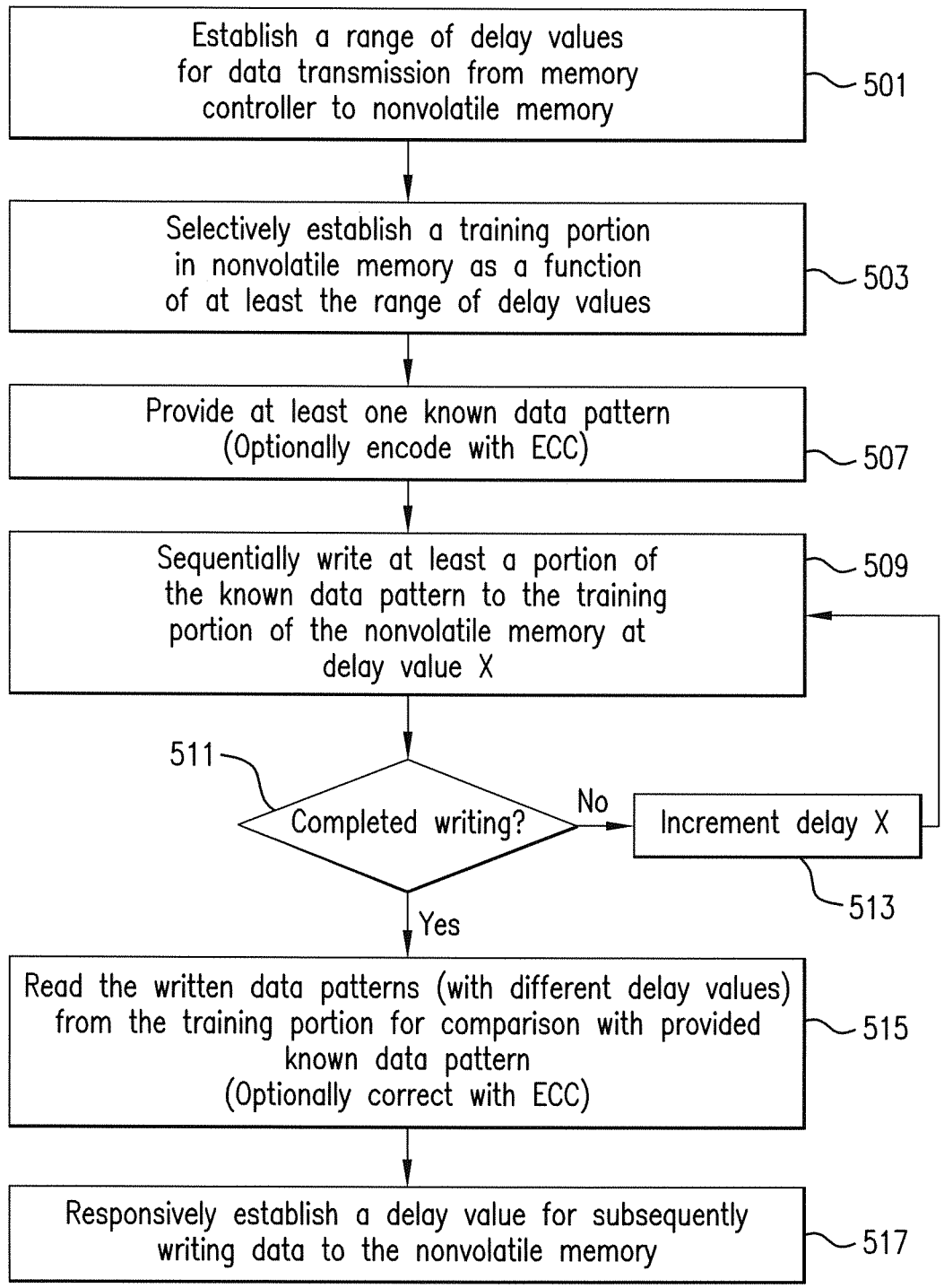
FIG. 5A is an exemplary flow diagram illustrating a write delay training flow.

Write and read training will first be explained without regard to the order in which they are best carried out. As seen in FIG. 5A, an exemplary flow for the process of establishing an optimal delay value in a write operation to the memory is shown. At block 501, a range of delay values for data transmission from memory controller to nonvolatile memory are established. Such range of delay values may be established by determining a set of discrete delay values possible in the delay circuit, such as seen for example in FIG. 2. Alternatively, a range of delay values may be preprogrammed into the memory controller for adaptive selection thereof and use in triggering the data strobe signal. Other techniques or circuits for selective delay of signals may be used as well. The range of delay values may substantially encompass the entire available range of available delay values provided by delay circuit, or may employ heuristics or other such optimization measures to determine a subset of the entire range of available delay values. For example, an approximation-range based on a Bell curve, a statistical analysis, simulation, modeling, or the like, may be employed to selectively focus the search for a suitable delay value to a particular range within the available delay values. Once the range of delay values to be used in training has been established, flow proceeds to block 503.

At block 503, a portion of memory to be used as a training portion is established in the nonvolatile memory. The training portion is established as a function of at least the range of delay values established at block 501. If, for example, it was determined that a range of 512 delay values are provided, then a training portion of the nonvolatile memory encompassing at least 512 discrete storage segments would be selectively apportioned. If, on the other hand, the range included 128 discrete values of delay, then a smaller training portion of the nonvolatile memory may be established to accommodate each of the 128 delay values. The resolution of the incremental delay steps can be selected as appropriate for the transmission speed of the data. The higher the resolution, the more fine the adjustment of the delay between the data strobe and the data signals, however, a larger training portion must be designated in the nonvolatile memory. Another major consideration is the minimum addressable portion of the nonvolatile memory that can be written to, read and erased. Since a block is typically the smallest addressable unit that can be erased, the training portion will consist of one or more blocks.

For a specific example, if the delay circuit 130, as shown in FIG. 2, were to have 16 discrete delay values selectable by the multiplexer 132, and the nonvolatile memory was a standard NAND flash nonvolatile memory device, a training portion of one block may be established and include at least 16 separate pages or sectors for writing to and subsequently reading from.

The establishment of the training portion preferably also includes an analysis of the nonvolatile memory to ensure that bad data sectors are not employed. Such analysis may be performed as would be known to one of skill in the art, such as by employing a table, list, or file demarcating bad storage areas to avoid usage thereof. The analysis will further include wear-leveling measures to prevent over-use of the various portions of the nonvolatile memory. In such manner, a balanced use of the sectors is maintained to avoid premature failure of the sectors or pages. Preferably, a known assigned block is employed without pre-existing data being stored therein. Suitable measures to consult with an operating system, software, or the like to determine use/non-use of blocks of the memory may be employed.

However, to establish a known-good state—and to verify operability of the selected training portion, the block is erased to clear and set all data values perhaps at NULL. If the erasure operation fails, the block may be marked as bad, and flow may proceed to select a different block. Only once a good block has been selected will flow then proceed to block 507 to provide at least one known data pattern. The known data pattern may be generated inside the memory controller or received from an external source such as software executing on a processor outside of the memory controller, or a pseudo-random pattern generator (PRPG), or the like. Software residing on a processor in an operating system may establish a known data pattern which may be provided as input to the memory controller which then uses such known data pattern for training.

Alternatively, the memory controller with one or several registers, flip-flops, caches, or other such memory disposed therein may be prepopulated with a known data pattern. The known data pattern may be any data pattern provided that it is retained and subsequently retrievable for future comparisons with a written and retrieved data pattern from the nonvolatile memory. For example, a known data pattern may include a random data pattern, a string of ones, a string of zeros, an alternating string of zeros and ones, or other such orthogonal or conspicuous data patterns. It may be advantageous to provide more than one known data pattern, such as a first data pattern of zeros, and a second pattern of ones. In such manner, the orthogonal data patterns may better help to evaluate errors or may lessen hardware, software, processing or memory requirements for ECC, and other such measures. Thus, the known data pattern may be encoded with ECC subsequent to being provided or generated.

Flow then proceeds to block 509 to sequentially write at least a portion of the known data pattern to a sector of the training portion of the nonvolatile memory starting with a first delay value X. Each block of memory includes multiple pages and each page has multiple sectors. The memory controller operates to sequentially (and preferably in a continuous burst mode) repetitively write at least a portion of the known data pattern to fill a sector of the training portion of the memory, each iteration with an incrementing delay value X. After at least a first portion of the known data pattern is written to the at least a sector of the training portion, flow proceeds in a cyclic loop to decision block 511 to determine if the writing operation is completed. Preferably, the writing is not complete until the full range of delay values established at block 501 has been substantially encompassed. If, for example, 128 delay values were established in block 501, then decision block 511 would not exit with an affirmative answer until at least 128 different delay value portions had been written to the nonvolatile memory device. Of course, in certain configurations, this range may be reduced according to heuristics, simulation, statistical analyses, or characteristics of the system according to probability to further expedite and shorten the training time. While the evaluation at block 511 remains in the negative, flow proceeds to block 513 to increment the delay value X and successively proceed in looped manner to block 509 to write the known data pattern into another sector. Upon completion of writing determined in block 511, the training portion will be substantially populated with different sectors populated with at least portions of the known data pattern provided at block 507. Each of the different sectors of the nonvolatile memory unit, as discussed above, are written at different delay values of the data strobe signals DQS relative to the data signals DQ.

Upon completion of writing, flow proceeds to block 515 where the written data patterns (with different delay values) are read from the training portion for comparison with the provided known data pattern. At opposite extremes within the range of established delay values, the retrieved known data patterns from the nonvolatile memory are irretrievably corrupted, due to the fact that the data strobe signal is either too early or too late. If the written data was ECC encoded, then the data read is passed through ECC correction logic prior to the comparison step. Even with ECC error correction, the data errors resulting from the relatively great delay between data strobe and data signals results in uncorrectable errors in the units of data. Thus, as the comparison sweeps through the range, reading a sector and comparing it to the known pattern, a range of suitable delay values is determined. Thus, initially the data will not be properly read due to misalignment between the DQS and DQ signals; then at some point good data will be returned indicating alignment of the leading edge of the DQS signal with the trailing edge of the DQ signals and one end point of the range of delay values; good data will continue to be read until the delay increment has moved the leading edge of the DQS signal past the leading edge of the DQ signals, establishing the immediately preceding delay value where good data was read as the other end point of the range. The range of different delay values will depend upon resolution of the delay increments. When the range is determined, a central alignment within the range is selected using the average or median delay value of the range, providing an optimized delay value for subsequent writing operations to the nonvolatile memory. In the event that the resolution was so coarse that only a single delay value returns in a comparison resulting in identity between the provided known data pattern and the pattern read from the memory, then the single delay value will be employed for future writing operations. Flow then proceeds to block 517 to establish the data value for subsequently writing to the nonvolatile memory. Subsequent writes to the nonvolatile memory will then employ the established delay value to accordingly delay at least one of the data strobe signal and the data signals, one relative to the other. In the case where each individual data line DQ is delayed relative to the date strobe signal DQS, such analysis is run for each of the data signal lines DQ to determine the optimal suitable delay values for each of the data signal lines relative to the data strobe line DQS.

Figure 5B:
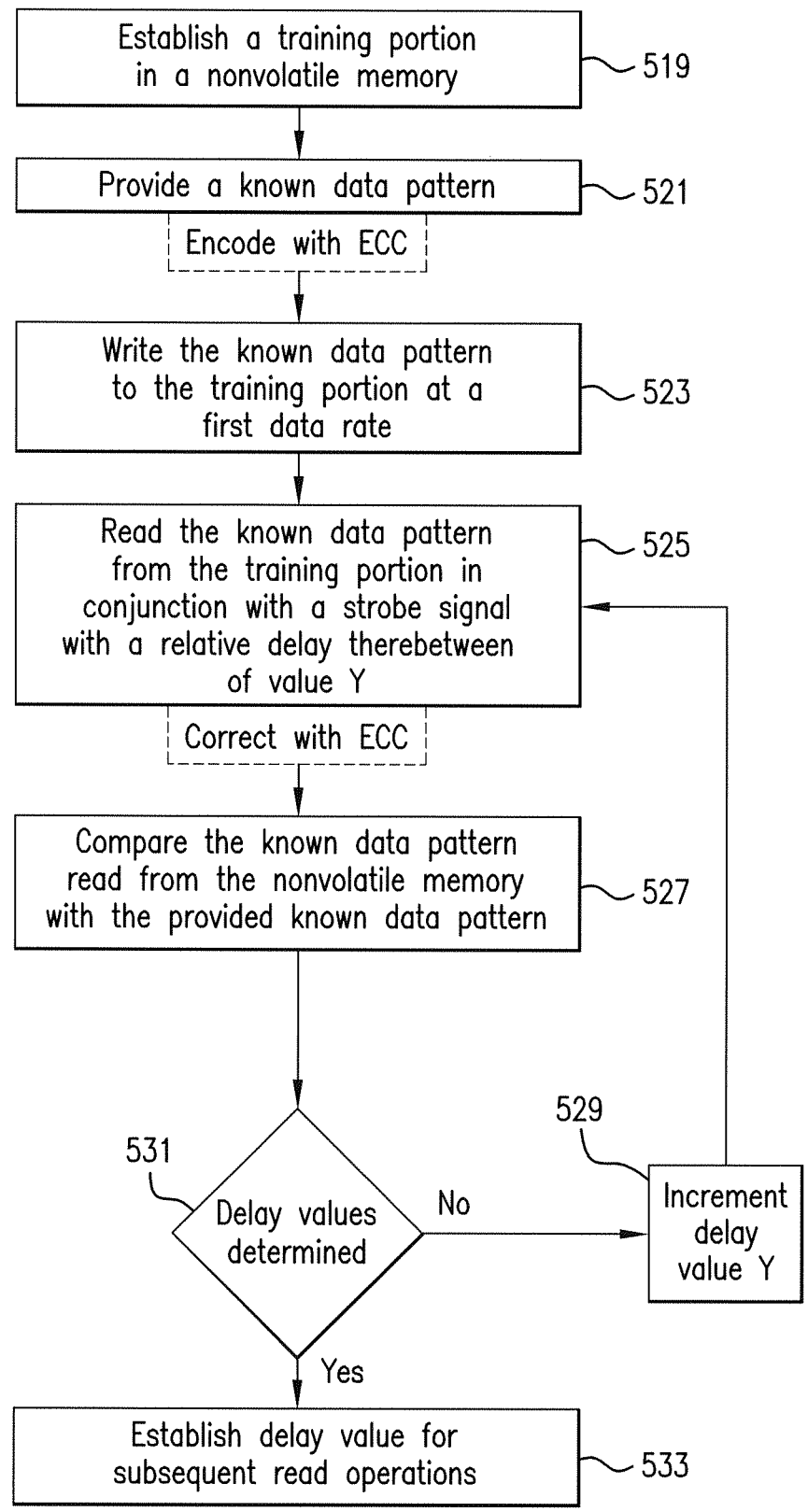
FIG. 5B is an exemplary flow diagram illustrating a read delay training flow.

Turning to FIG. 5B, an exemplary flow for establishing a suitable delay value for a reading operation from a nonvolatile memory is illustrated. While FIG. 5A appears before FIG. 5B herein, the order of read and write training may be suitably reversed or used in concert or independently. However, as will be described in following paragraphs, the read training is performed first followed by the write training, which is believed to be more efficient.

At block 519, a training portion is established in the nonvolatile memory, as was described for write training. For example, the smallest erasable unit of the nonvolatile memory (typically a block), or multiples thereof, may be employed. Such reservation is preferably done in accordance with a determination of an anticipated size of a known data pattern with an evaluation of used storage space; an evaluation of the reliability (preferably excluding known-bad sectors, pages, blocks, or segments), and with consideration of wear-leveling. The identified training portion is then erased. If the erase operation fails, a new block(s) of memory must be assigned before the training can proceed.

Once a suitable training portion has been established, a known data pattern is provided at block 521. As nonvolatile memories are known to have data storage reliability issues, the known data pattern may be encoded with error correcting codes (ECC). Flow then proceeds to block 523 where the known data pattern or optionally ECC encoded known data pattern is written to the training portion at a first data rate. Preferably, the first data rate is a single data rate (SDR) transmission mode and is considered a low frequency writing mode of the nonvolatile memory. The SDR is employed to ensure a reliable—though slower writing operation. If, however, the flow as seen in FIG. 5A (for establishing a suitable delay for the writing operation) has already been completed, then the known data pattern may be written safely and reliably to the nonvolatile memory employing a higher speed data rate, such as double data rate (DDR), quadruple data rate (QDR), or the like.

Flow then proceeds to block 525 where the known data pattern is read from the training portion of the nonvolatile memory in conjunction with a strobe signal with a relative delay value Y therebetween. The read known data pattern is evaluated for errors. If the data was encoded with ECC, the data that is read is passed through error correction logic. Flow proceeds to a comparison block 527 where the read or corrected read data pattern is then compared with the provided known data pattern.

Preferably, the delay values are swept starting from a first extreme position within the established range of data delay values until a read data pattern (ECC corrected data pattern) matches the provided known data pattern. The point at which the read known data pattern is evaluated to be good marks a leading edge detection, one end of the range of delay values that properly capture the data signals. The delay is then repeatedly incremented with each repetition of reading that same page of data until the read known data pattern no longer matches the provided known data pattern. This occurrence signifies the trailing edge detection.

By identifying the leading and trailing edges of the DQS signal with respect to the DQ signals provides range of suitable delay values for the data signals relative to the data strobe, and by then establishing a delay value that is substantially central-aligned, an optimal delay value is determined. The optimized delay value is then preferably employed for subsequent reading operations. Until both the leading and trailing edge delay values have been determined at block 531, a cyclic loop is established with the flow going to block 529 to incrementing the delay value Y and then returning back to block 525. Upon determination of that both end points of the delay range have been determined at block 531, the flow then proceeds to block 533 where the optimum delay value is established for subsequent reading operations, delay that substantially centers the DQS signal rising and falling edges centrally on the data signals DQ.

Figure 5C:
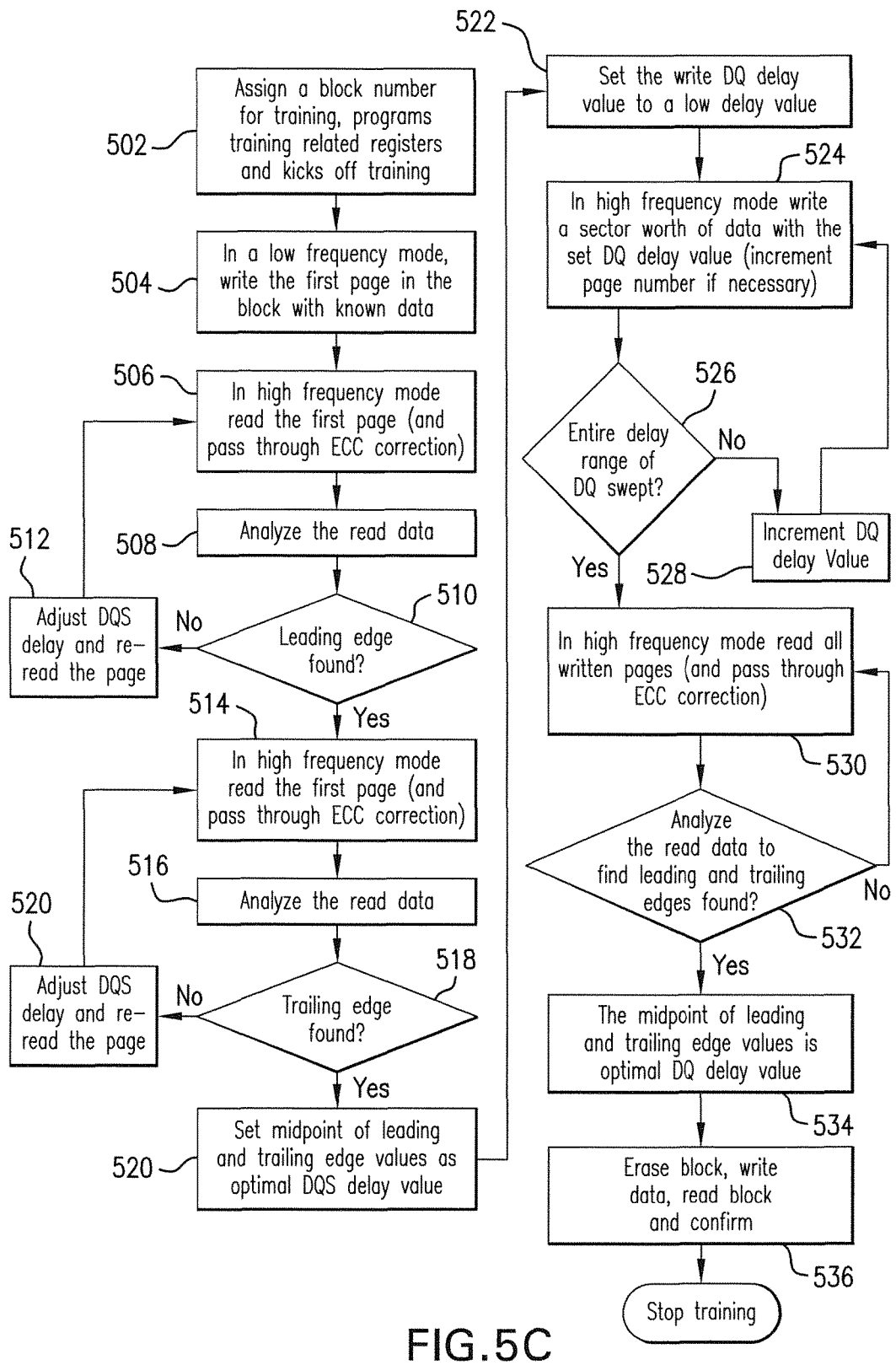
FIG. 5C is an exemplary flow diagram illustrating a more detailed flow of processes in the disclosed system and method for aligning both read and write data and data strobes for a nonvolatile memory.

As seen in FIG. 5C, a read training followed by a subsequent write training (employing the delay value determined during read training) is illustrated. At block 502, an address is assigned for a training portion of a nonvolatile memory, as discussed above. In an exemplary configuration, a nonvolatile flash memory, such as a NAND flash or NOR flash memory, may employ an addressing scheme for such units as chip, block, page, sector. In such manner, a chip is selected, a block portion of the chip, a page portion of the block, and a sector are selected for training. A block is generally 2048 Kbytes composed of about 256 pages of 8 Kbytes a piece, and each page may generally be composed of about four sectors at 1-2 Kbytes a piece. The training portion is at least the smallest unit which can be addressed for erasure.

Once a segment of the nonvolatile memory has been selected for training, the flow proceeds to block 504. The memory controller/PHY establishes a low-frequency high-reliability mode (such as SDR) for transmission to write at least an entire page of the training portion with a known data pattern. The known data pattern may be a pseudo-random pattern, such as may be generated by a pseudo-random pattern generator (PRPG). Alternatively, the known pattern may be a predefined pattern, such as "0101010101010101 . . .", or the like. In some regards, a highly orthogonal known data pattern may prove beneficial. In some configurations, alternating between two or more known data patterns may prove useful in delineating sectors for subsequent error determination purposes. Flow then proceeds to block 506 once a known data pattern is written to the training portion of the nonvolatile memory. The DQS signal is initially delayed relative to the DQ signals with a delay of zero (no delay), but due to skew in the timing due to difference in the path length and transmission characteristics of the conductors, the DQS signal is likely to be out of alignment with the DQ signals and therefore initially good data will not be captured.

Optionally, an error correcting code (ECC) may be employed to encode the known pattern written into the memory and then utilized to selectively regenerate bit errors when the data is retrieved from the nonvolatile memory, to compensate for the relatively high rate of bit-flip and other errors expected with this type of memory. The ECC does not correct for timing errors between the DQS and DQ signals. The ECC functionality will be known to one of skill in the art, but suffice it to say that a predetermined portion of the written data pattern may include a yet smaller portion of the ECC code which seeks to digest the substantive payload of the known data pattern. For example, if a known data pattern is for example 1,024 bytes, an ECC code may occupy anywhere between for example 32 and 64 bytes to effectively safeguard against one or a few errors occasioned upon the known data pattern in the nonvolatile memory. Any suitable ECC measures and sizes may be employed consistent with the reliability of the nonvolatile memory under training.

The memory controller then switches to a high-frequency mode (which may be on the order of anywhere between about two and about twenty times faster than the low frequency mode) to read in the entire page that was written to the nonvolatile memory. Flow then proceeds to block 508 to analyze the retrieved data from the nonvolatile memory. Block 508 determines whether the retrieved data matches the known data pattern. Flow then proceeds to block 510 to determine if the leading edge has been found, the point where the trailing edge of the DQS signal aligns with the leading edge of the DQ signals and good data is captured (the read data matches the known pattern). If the leading edge has not yet been found, flow passes to block 512 where the delay of the data strobe signal DQS is incrementally increased. Alternately, the data signals DQ could be adjustably delayed relative to the data strobe signal DQS. Subsequent to incrementing the delay value applied to the DQS signal, flow passes back to block 506 where the page is re-read from the nonvolatile memory. In a preferred configuration, the DQS data strobe signal is delayed during the read training while the DQ data signals are delayed during the write training, though this, of course, may be reversed depending upon the application and the hardware employed.

In such manner, a loop is executed to continuously read the written known data pattern to find the amount of delay that aligns the trailing edge of the DQS signal with the leading edge of the DQ signals. Once the leading edge has been determined at decision block 510, flow proceeds to block 514, where, in high frequency mode, the first page is again read and optionally passed through ECC correction. Flow then proceeds to block 516 to analyze the read data from the nonvolatile memory. In block 516 it is determined whether or not data matches the known data pattern, and then flow proceeds to block 518 to determine if trailing edge alignment has been found, the point where the leading edge of the DQS signal aligns with the trailing edge of the DQ signals. Once the leading edge detection has been made, the data read will continue to be good until sufficient delay has been added to shift the leading edge of the DQS signal where it aligns with the trailing edge of the DQ signals, at which delay value good data will no longer be captured. That event, the loss of accurately retrieving the written data, signifies trailing edge alignment. Where the trailing edge alignment has not been identified, the flow passes to block 520 where the data strobe delay value is incremented and the flow then passes to back to block 514 where the page is reread using the new delay value applied to the DQS signal.

Upon detection of the delay value for trailing edge alignment, flow passes to block 520 to establish a delay value for the DQS signal where the leading and trailing edges of the DQS signal align centrally between the rising and falling edges of the DQ signals. That optimal delay value is the average or mean of the delay values of the leading and trailing edges detections determined in blocks 510 and 518, respectively. The averaging may be accomplished by any suitable measures as would be known to one of ordinary skill in the art, such as for example, leading edge delay plus trailing edge delay divided by two, or other such measures. Having determined the optimal delay value, the entire page of data is then reread using the optimal value to confirm that it is read without errors.

Once an optimal reading delay value of the DQS signal relative to the DQ signals has been established and verified at block 520, flow proceeds to a write training procedure starting at block 522 where write data delay value is established. While FIG. 5C shows an exemplary embodiment of delaying the data strobe in the reading portion and a data signal in the write portion, it is emphasized that these delays may (in certain configurations) be interchangeable and it is the relative delay between data strobe and data signals that is sought to be adjusted responsive to comparison of the written known data pattern, written at various different delay values, read from the memory vs. the provided known data pattern.

In high frequency mode (for example the double data rate DDR) a sector of a page in the training portion is written with the known data pattern. In place of a sector, a larger segment, for example, multiple sectors, a page, or the like can be used if desired. The first sector is written with the delay value set at one end of the range of delay values for the DQ signals relative to the DQS signal Flow then proceeds in cyclic manner to block 526 to determine if the entire range of DQ delay has been encompassed. If the entire delay range has not been encompassed, then flow proceeds to block 528 to increment the data signal DQ delay value and then back to block 524 for successive write operations, each with a successively incremented delay value. Only once the entire delay range has been swept, as determined at decision block 526, does flow then proceed to exit the loop and pass to block 530 for a high frequency mode read of one page at a time so that all the written sectors can be analyzed. In such manner, the entire delay range may be written sequentially in, for example, a single burst. Only once the write operation is complete does a read of the data patterns (written at different delay values) get performed. Each of the sectors of the training portion are written with incrementally increasing delay values and are read back for subsequent comparison with the known data pattern used during the write operation. Alternatingly writing and reading over and over again with delays being incremented between write-read cycles is not practical for implementation in a nonvolatile memory from both a cycle time stand point and addressing limitations thereof. Since the nonvolatile memory must be erased before it can be rewritten to, such operational delays may be substantial. Due to the fact that the smallest unit that can be erased is a full block, successive write-read operations of a sector or page are not very practical.

Returning to block 530, if ECC encoding was used in the write operation, then ECC correction may be employed with the data that is read to correct minor bit flip errors typically encountered in nonvolatile memories. The flow passes from block 530 to block 532. At block 532, the data read from the sectors of the page nonvolatile memory that were read are sequentially analyzed to determine if the read data matches the known data pattern. The first sector whose data matches the known data pattern identifies the leading edge alignment between the data signals DQ and the data strobe signal DQS when it was written in the corresponding sector. Thus, the process continues with the flow looping from block 532 back to block 530 until the trailing edge alignment is found. As has previously been discussed, the trailing edge alignment between the data signals DQ and the data strobe signal DQS when it was written is detected when the data read changes and again ceases to match the known data pattern. Once the trailing edge has been found, the flow passes to block 534. In block 534 the average (mean) of the delay values corresponding to the leading and trailing edge alignment detections is determined to establish an optimum write delay of the data signals DQ relative to the data strobe signal DQS, placing the rising and falling edges of the DQS signal centrally on the data signals DQ.

Once the optimum DQS and DQ delay values have been established, the flow passes to block 536. In block 536, the entire training portion, typically one block, is erased and then the entire training portion is rewritten in the high-speed mode with the known data pattern using the optimum DQ delay value that was established in block 534. Then, the entire block is read in a high speed mode using the optimum DQS delay value established in block 520. The data read is compared with the known data pattern to confirm errorless write and read operation. The confirmation step ends the training process; however, if errors were detected in block 536, an error notification is transmitted to the host processor to which the nonvolatile memory controller is connected. It should be understood that the DQ delay value determination which is performed for the write training may beneficially be performed once for each data line. The optimum delay value for each of the data lines is then averaged in block 534 to obtain an overall optimum delay value of the DQ signals relative to the DQS signal.

By employing the optimized delay value (in the middle of the suitable range), the greatest tolerance to either late or early data signals DQ relative to the data strobe signal DQS, during either a write or read operation, may be accommodated. In such manner, both the fabricated device and/or circuit design thereof under test may operate with less constraints and at higher data rates and frequencies while retaining reliable data transfer to and from the nonvolatile memory. For example, circuit designers of the device may be given greater latitude to diverge from identical trace lengths for the data lines (DQ). Designers may thereby be able to diverge from a grouped bus (if beneficial to the particular design) with less detrimental impact and resulting skew. By providing freedom to circuit designers to follow workable paths for the data signal lines or the data strobe signal line in relation to the data signal lines, the design may be better able to achieve closure and sign-off through certain simulations and modeling where timing skew problems are remedied with read/write training. Additionally, in the fabricated device, certain timing anomalies or aberrations may be more gracefully accommodated through the periodic re-alignment or training of the delay values between data signals and data strobe signals to account for such changing operational conditions. The periodic re-alignment may be performed responsive to a set-time, or responsive to detected operational conditions—such as an unexpectedly high level of data transmission errors, detected temperature or voltage changes, or the like.

Figure 6:
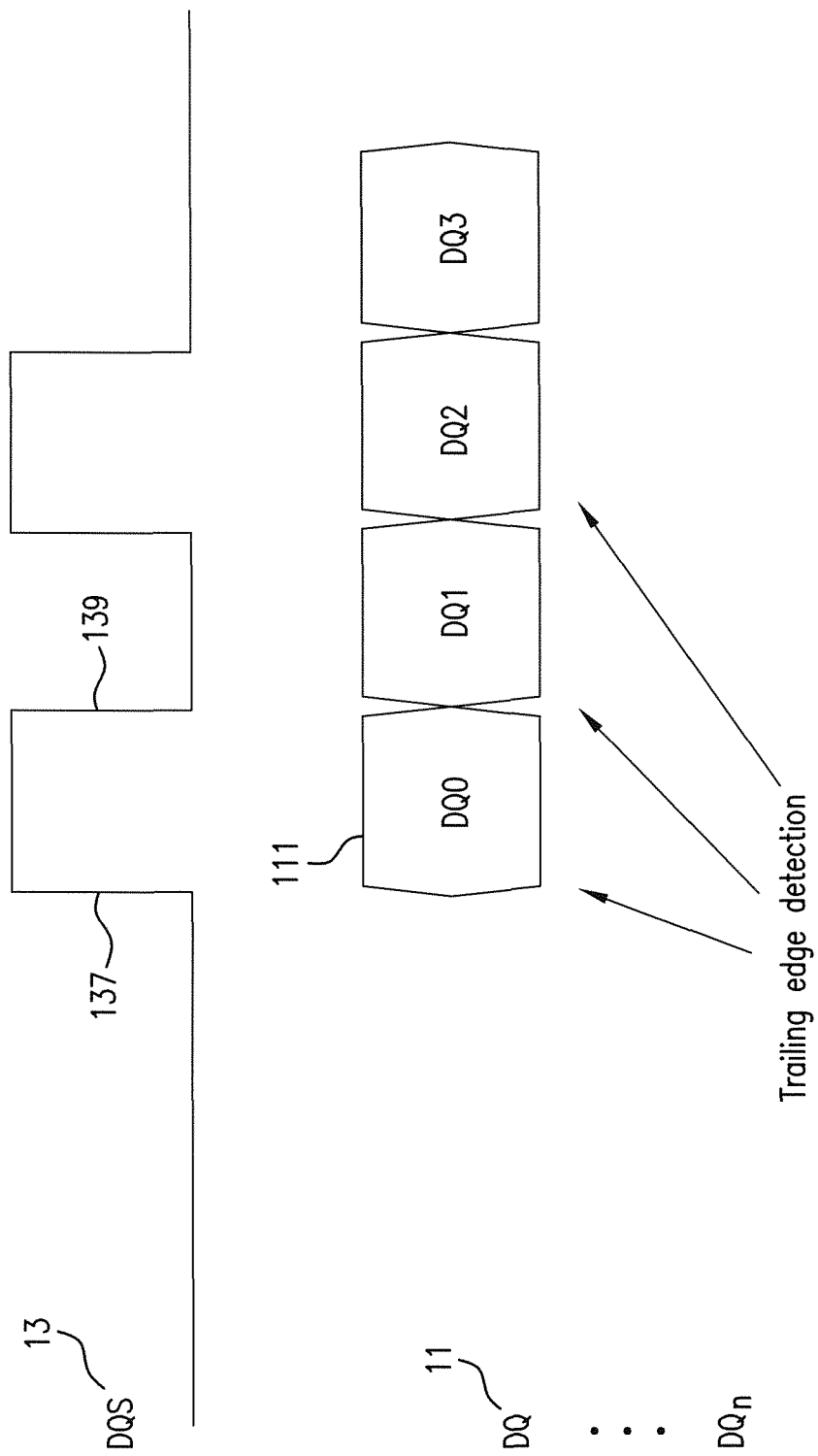
FIG. 6 illustrates an exemplary induced delay between the data signals and data strobe signal.

As seen in FIG. 6, at least one of the data signals DQ and the data strobe DQS are adaptively delayed one relative to the other to determine a suitable range of delay values and preferably an optimized delay value for use in subsequent nonvolatile memory reading and writing operations. In an exemplary read training flow, the data strobe is delayed at a substantially extreme position within a known range of delay values. The data strobe 13 is, in other words, pushed to an extreme value, such as approaching 127 or 0 for a delay circuit with a range of 0 to 127. The number of steps and the amount of delay for each step is dependent on the process technology and the design of the delay cell being used.

The data is read from the memory device by the memory controller at the established extreme end delay value. If the data pattern read from the nonvolatile memory is corrupt, this would indicate a misalignment of the data strobe and the data values. From the extreme end of the delay values, the data strobe is successively or iteratively reduced to sweep through the available range of delay values e.g. 127, 126, 125, 124, etc. Through the sweeping operation, the suitable range or set of delay values is determined. Upon the data pattern read from the device becoming substantially identical or passing a comparison evaluation (relative to a known data pattern), a first end of the range of suitable values is determined. Successively decrementing, incrementing, or adjusting the delay value between the data strobe and the data signals sweeps through the range of suitable values until the data pattern is no longer able to pass a comparative evaluation. The data strobe value is swept through a range of values until the retrieved data pattern can no longer satisfy an evaluative comparison between the retrieved known data pattern and the provided known data pattern. At such point, the range of suitable delay values has been demarcated with both a leading and trailing edge thereof. The delay values may continue to be swept through to the other extreme end of the available range of delay values or analysis may truncate having determined a suitable range of delay values depending upon application.

Figure 7:
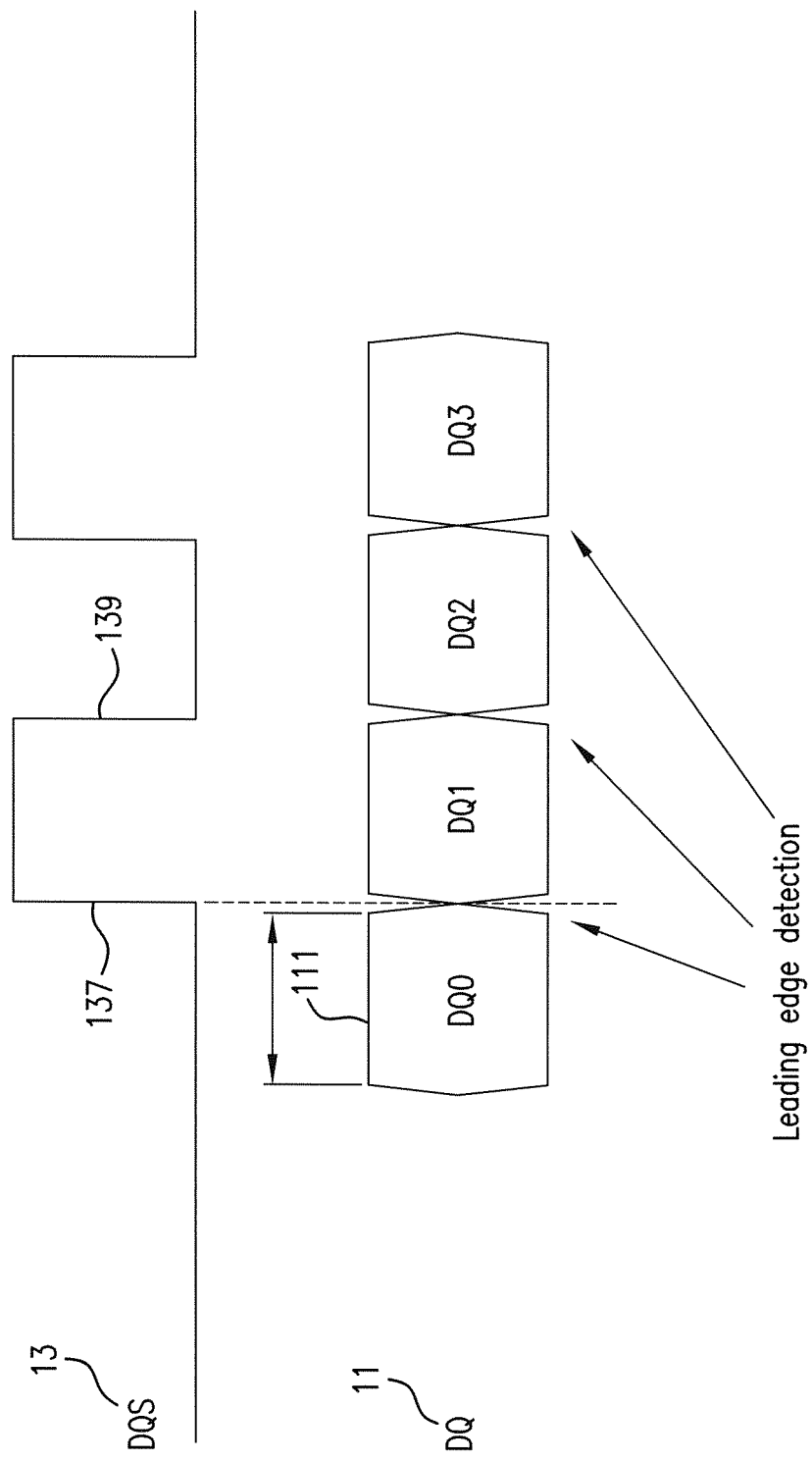
FIG. 7 illustrates yet another exemplary delay induced between the data signals and the data strobe signals.

FIG. 7 shows such a sweep through the suitable range of delay values to determine the leading and trailing edges. While FIG. 6 shows the determination of a trailing edge in the write operation, FIG. 7 shows an exemplary illustration of the leading edge determination on the reading portion for the suitable range of delay values. Returning to FIG. 6, each of the data portions 111 are merely characteristic abstractions of data bits. Each data line DQ 11 may be one of plural, where DQ0, DQ1, DQ2, and DQ3 are simplified examples representing an entire bus, or segments, of bit lines. The analysis may proceed from either extreme end of the available range of delay values, or may start from a point midway between an extreme end and a predicted leading or trailing edge of the suitable range of delay values. Heuristics and other such evaluation of the delay circuit, components, routes, or operational timing data from earlier timing analyses (such as those performed during signoff or the like) may be evaluated in a preparatory stage to determine a most optimal starting point for the sweep through the available delay values. One goal is to determine a suitable or optimized value for the delay such as seen in FIG. 4A, effecting a substantially central-alignment of the data strobe and data signals. It is envisioned that the alignment process will be completed with each individual DQ data line with respect to the data strobe in successively iterating fashion. Only once each of the data lines 11 DQ-DQ$_n$ are properly evaluated with a delay value is the evaluation complete. For example, an optimal delay value for one DQ line may not be optimal for another DQ line. Thus, a determination of a range of suitable delay values for each DQ line relative to the data strobe may be performed in an overlap analysis of each of the plural delay ranges between delay lines may be evaluated to find a common workable or suitable delay value common to each of the data lines relative to the data strobe. In such manner, a delay value which may not be ideal or optimal for any one of the data values may ultimately be employed to give a suitable timing alignment for all of the data lines. A designer is thereby provided with the greatest flexibility and the least number of constraints when placing and routing data transmission lines and data strobe lines between the memory controller and the nonvolatile memory to allow more expedited signoff and fabrication of integrated circuit (IC) devices.

Figure 8:
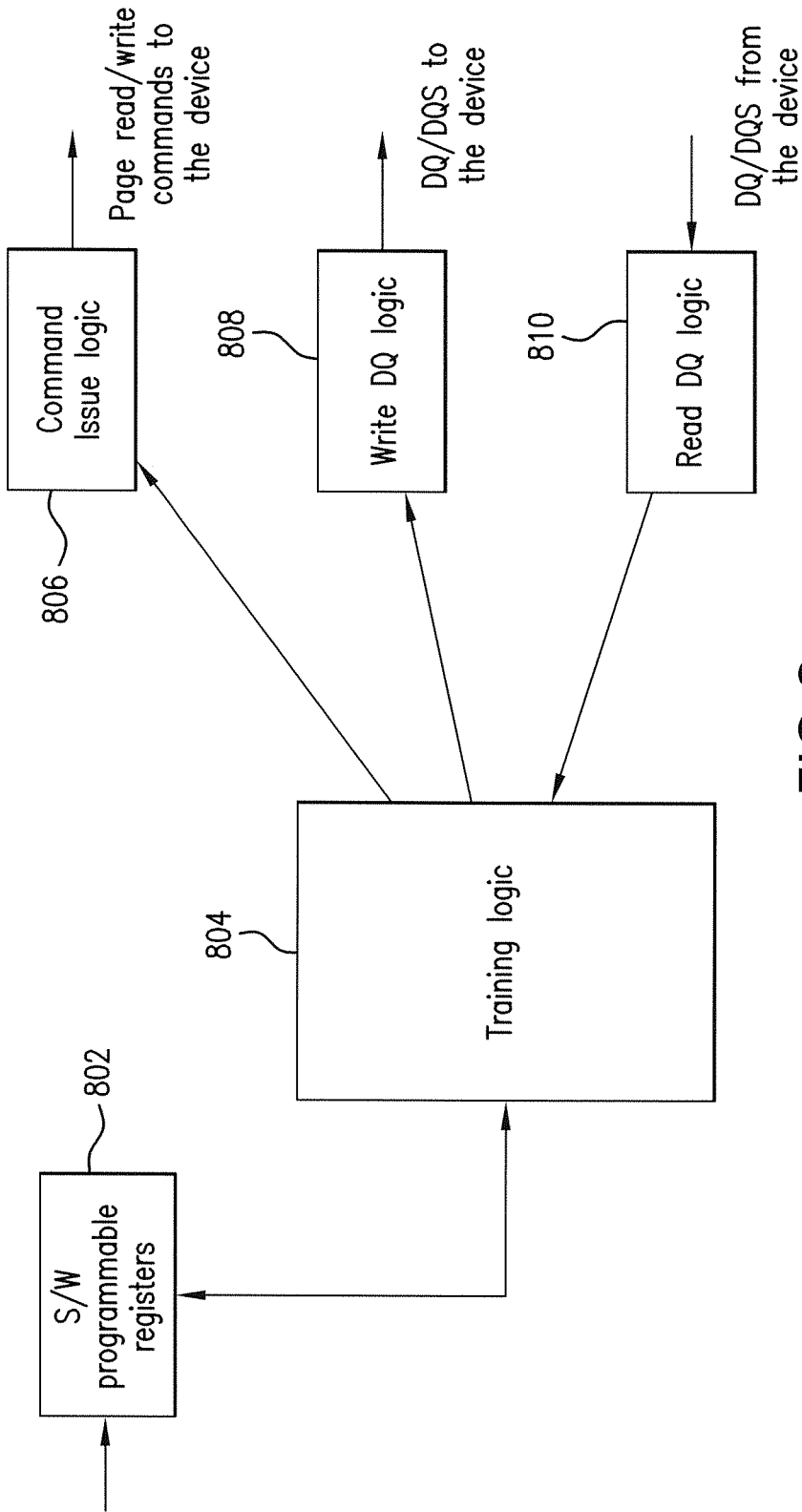
FIG. 8 is a block diagram of an exemplary training logic.

FIG. 8 provides a more detailed block diagram of a training logic 804 employed to train both the reading and writing of the nonvolatile memory to establish the respective delay values for both read and write operations thereof. A software programmable register 802 may receive a designation of a number of operational parameters from software which may run within a processor or system-on-chip, or the like. Such operational parameters for the training may include an indication of the available hardware delay circuits, a range of delay values, an indication of a location within the nonvolatile memory for the training portion, a size thereof, an enumeration of the different data rate modes available to the memory controller and the nonvolatile memory device, amongst other exemplary operational parameters. Beyond operational parameters, certain other data may be retrievable or acceptable into the software programmable registers 802 such as a pre-established known data pattern, the output of a pseudo-random pattern generator (PRPG), or the like. Software programmable registers 802 are either disposed in the training logic 804 or in operable communication therewith. Training logic 804 may be incorporated within a memory controller, external thereto, or within an integral portion of the nonvolatile memory. Any other suitable location of the training logic 804 may be employed as well.

Training logic 804 serves as a training module and may be composed of a number of gates, in an application specific integrated circuit (ASIC), a field programmable gate array (FPGA), programmable logic array (PLA), or may be suitably simulated with one or more software modules. Training logic 804 may execute certain sub-modules either disposed therewithin or therewithout, such as command issue logic 806, write DQ logic 808, and/or read DQ logic 810. The command issue logic 806 may issue page read/write commands to the device along with certain operational parameters, such as a data rate selection, addressing such as sector, page, block, chip select, random data output (RDO) operational modes, and the like.

The random data operation (RDO) mode is preferably employed in the read training of the nonvolatile memory. In such manner, the known data pattern may be written to the training portion of the nonvolatile memory and upon completion of a first read operation therefrom, the RDO may be enabled to allow the shifting of a pointer back to the training portion of the nonvolatile memory to allow for repetitive reads of the same portion without incrementing to subsequent portions. Thereby, substantial time savings may be realized by repetitively reading the same training portion or segment thereof without advancing to other portions or changing operational modes. Command issue logic 806 may also be suitably implemented in discrete logic gates such as in an ASIC, an FPGA, or suitable software module(s) within a fabricated device or within a pre-fabrication simulation such as during sign-off or placement and routing analysis of a circuit design for eventual fabrication.

The write DQ logic 808 implements DQ data and data strobe signals to the device. Read DQ logic 810 implements read data signals and data strobe signals from the device. Any number of other such suitable logic portions may be employed as would be apparent to one of skill in the art.

Figure 9:
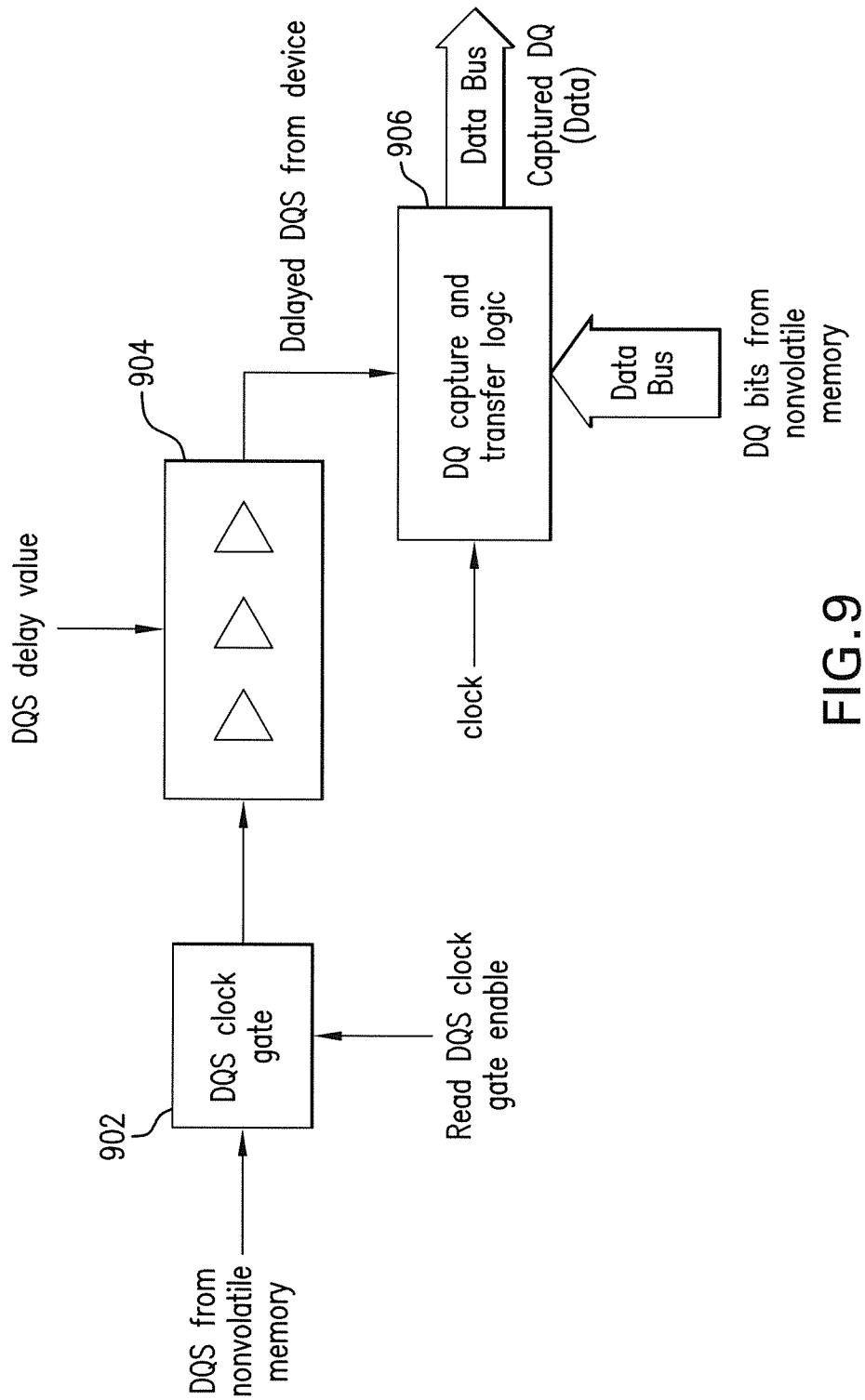
FIG. 9 is a schematic block diagram of an exemplary DQS delay structure in accordance with a read training portion.

FIG. 9 is an exemplary schematic block diagram of an implementation of a delay circuit. A DQS clock gate 902 receives a data strobe (DQS) from the nonvolatile memory. A read DQS clock gate enable is also received by the DQS clock gate and responsively at appropriate time during reads, the DQS clock gate is enabled to pass the incoming data strobe from the nonvolatile memory. The data strobe then proceeds from the DQS clock gate 902 to a DQS selective delay circuit 904. DQS selective delay circuit 904 may be as shown in FIG. 2 (a plurality of sequential stages of discrete gates tapped at selective points fed to a common selector unit such as a multiplexer), or the selective delay circuit may include any other suitable means, measures, circuits, modules, or the like, as would be known to one of skill in the art. The selective delay circuit 904 receives a DQS data strobe delay value as an input and responsive thereto selectively delays the incoming data strobe signal from the DQS clock gate 902. It is important to note that while the instant Figure shows the delay circuit being applied to the data strobe signal, in other embodiments and configurations according to the application, the delay circuit(s) may be applied to one or more of the data strobe line and the data lines themselves. Responsive to the delay value, the selective delay circuit 904 delays the DQS data strobe, and according to the delay, passes it on to the DQ capture and transfer logic block 906 in delayed manner. DQ capture and transfer logic 906 receives a clock signal, the delayed strobe signal, and the data bits from the nonvolatile memory. In synchronized manner, the DQ capture and transfer logic 906 then outputs the captured data.

Figure 10:
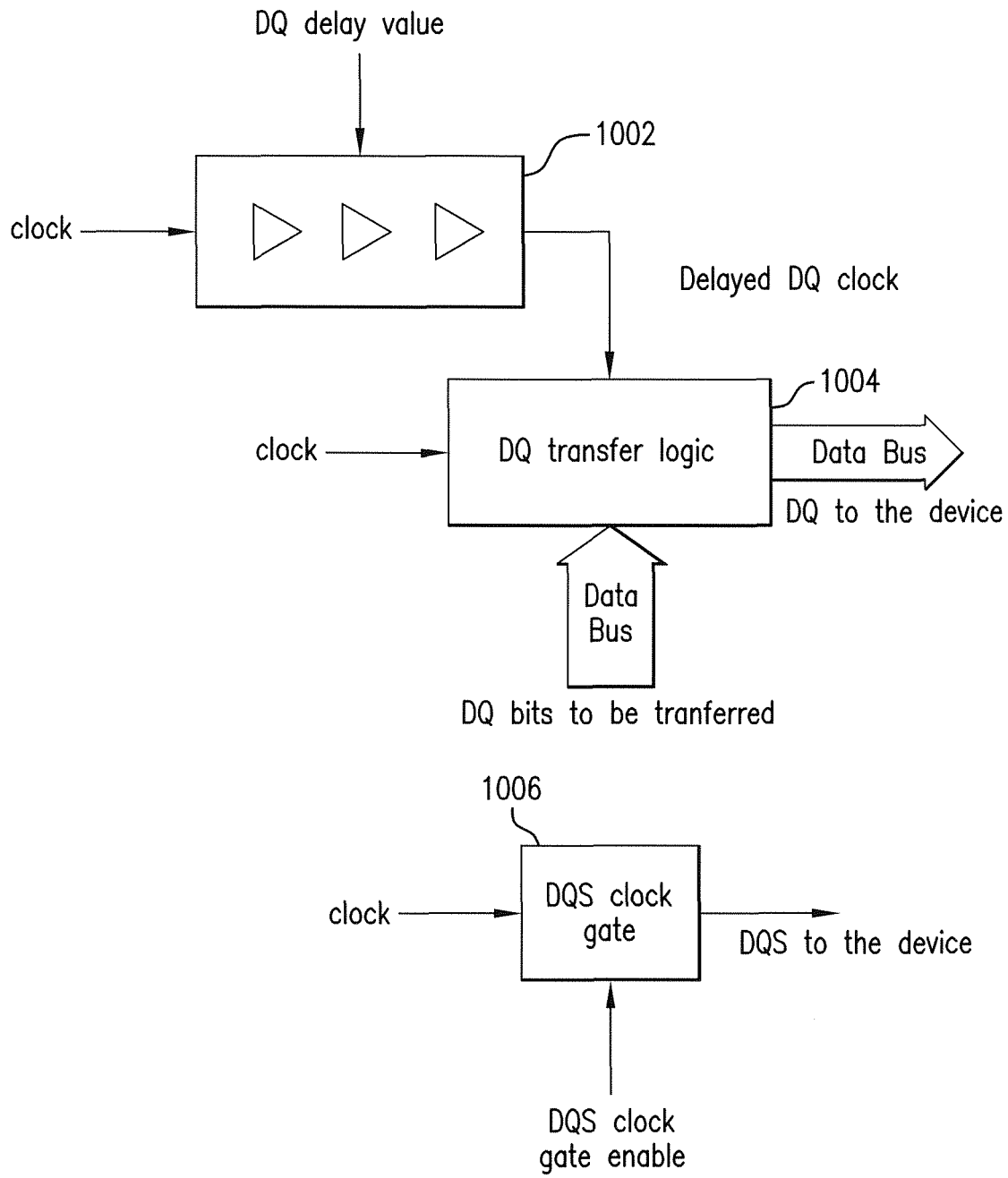
FIG. 10 is an exemplary block diagram of a selectable DQ delay structure in accordance with a write training portion.

As seen in FIG. 10 (and as discussed above), a selective delay structure 1002 is applied to each of the data DQ line(s). The clock signal enters the selective delay circuit 1002 along with at least one operational parameter including the DQ delay value. The DQ delay value configures the selective delay circuit 1002 to employ a delay channel or other delaying measures to delay the clock passing therethrough based upon the set DQ delay value to pass on a delayed DQ clock signal to a DQ transfer logic 1004. The DQ bits to transfer to the nonvolatile memory are moved from the clock domain to the delayed DQ clock domain in the DQ transfer logic. The DQ to the device will match the delay of the delayed DQ clock. The data strobe (DQS) of the device is not delayed and the clock is directly sent out by enabling the clock gate at the appropriate time to send the data strobe (DQS). In a configuration where a selective delay circuit 904 is applied to the data strobe lines, such delay may be set to a null value or a pass through. Alternatively, the data (DQ) delay value may be adaptively adjusted relative to a nominal DQS data strobe delay value to maintain a relative relationship therebetween. While the components of FIGS. 8-10 have been shown in separate manner, it is noted that they may be incorporated into a memory controller or as application specific integrated circuits (ASIC), field programmable gate arrays (FPGA), programmable logic arrays (PLA), suitable software modules, or the like. Such functional portions may be incorporated into the memory controller, the processor, a peripheral controller, or may appear separately.

In various configurations of the invention, the system may be implemented in the form of software modules, hardware modules, or some mixture thereof. In an exemplary configurations of the invention, the system is implemented as part of a fabricated electronic device, as part of an Electronic Design Automation (EDA) software suite, or may be implemented in any suitable circuit design tool.

Figure 3:
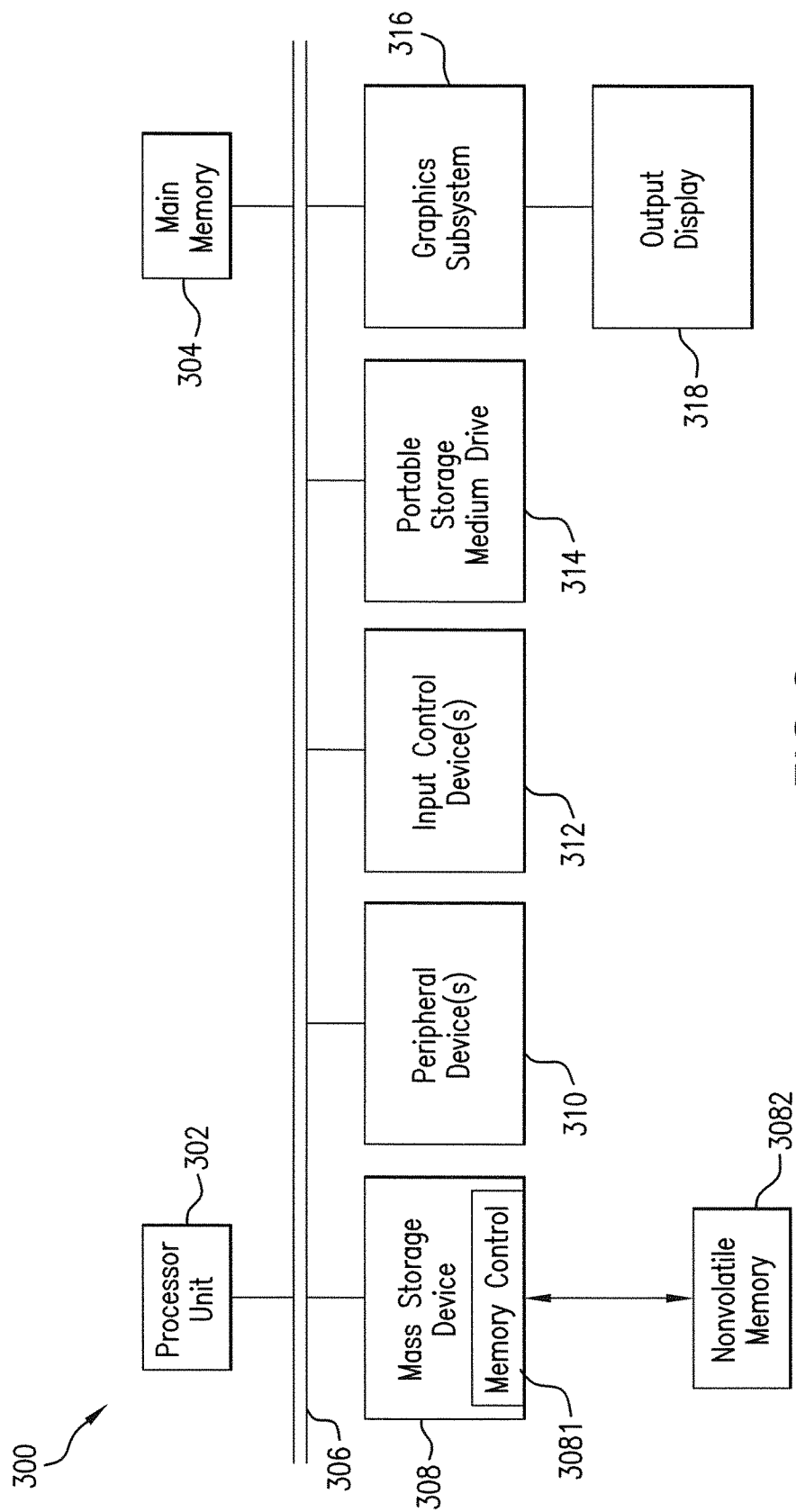
FIG. 3 is a schematic block diagram of an exemplary computer system for programmatic and/or hardware implementation of certain aspects of the disclosed system and method.

FIG. 3 illustrates a block diagram of a computer system which may serve as a host for such hardware modules and/or as a host for executing software modules such as EDA tools/simulations/emulation/firmware in accordance with various configurations of the present invention. A computer system 300 contains a processor unit 302, a main memory 304, an interconnect bus 306, a mass storage device 308, which may include a combination of memory controller 3081 and nonvolatile memory 3082, peripheral device(s) 310, input control device(s) 312, portable storage medium drive(s) 314, a graphics subsystem 316, and an output display 318. Processor unit 302 may include a single microprocessor or a plurality of microprocessors for configuring computer system 300 as a multi-processor system. Main memory 304 stores, in part, instructions and data to be executed by processor unit 302. Main memory 304 preferably includes banks of dynamic random access memory (DRAM) as well as high-speed cache memory.

For the purpose of simplicity, all the components of computer system 300 are connected via interconnect bus 306. However, computer system 300 may be connected through one or more data transport means. For example, processor unit 302 and main memory 304 may be connected via a local microprocessor bus; and mass storage device 308, peripheral device(s) 310, portable storage medium drive(s) 314, and graphics subsystem 316 may be connected via one or more input/output (I/O) buses. Mass storage device 308 may be implemented as a nonvolatile semiconductor memory for storing data and instructions to be used by processor unit 302. In a software configuration, mass storage device 308 may store the software to load it to the main memory 304 or may be represented in an EDA tool simulation by suitable classes (incorporating data structures and functions operable upon the data structures) or the like as would be known to one of skill in the art.

Portable storage medium drive 314 operates to input and output data and code to and from the computer system 300. In one configuration, the software is stored on such a portable medium, and is input to computer system 300 via portable storage medium drive 314. Peripheral device(s) 310 may include any type of computer support device such as an input/output (I/O) interface, to add additional functionality to computer system 300. For example, peripheral device(s) 310 may include a network interface card, to interface computer system 300 to a network. Peripheral device(s) may also include a memory controller and nonvolatile memory.

Input control device(s) 312 provide a portion of the user interface for a computer system 300 user. Input control device(s) 312 may include an alphanumeric keypad for inputting alphanumeric and other key information; and a cursor control device such as a mouse, a trackpad or stylus; or cursor direction keys.

In order to display textual and graphical information, computer system 300 contains graphics subsystem 314 and output display(s) 318. Output display 318 may include a cathode ray tube (CRT) display, liquid crystal display (LCD), plasma, or active matrix organic light emitting diode (AMOLED) display. Graphics subsystem 316 receives textual and graphical information, and processes the information for output to display 318.

In a software implementation, the EDA software includes a plurality of computer executable instructions, to be implemented on a computer system. Prior to loading in a computer system, the EDA software may reside as encoded information on a computer-readable tangible medium such as a magnetic floppy disk, a magnetic tape, CD-ROM, DVD-ROM, or any other suitable computer readable medium.

In a hardware implementation, the invention may comprise a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) may also be developed to perform these functions.

Thereby, a nonvolatile memory controller and nonvolatile memory may expeditiously train a relative timing delay between data strobe and data signals to effect high speed reliable transfer therebetween with great efficiency. The training method uniquely writes the data with the complete range of delays in a single write operation obviating the need to erase and rewrite the data for each delay iteration and the time required therefore during write training. The training method also uniquely rereads the same data pattern for each delay iteration during read training.

The descriptions above are intended to illustrate exemplary implementations of the present invention and are not restrictive. While this disclosure has been made in connection with specific forms and embodiments thereof, it will be appreciated that various modifications other than those discussed above may be resorted to without departing from the spirit or scope of the claimed invention. Such variations, modifications, and alternatives will become apparent to the skilled artisan upon a review of the disclosure. For example, functionally equivalent elements or method steps may be substituted for the specifically shown and described, and certain features may be used independently of other features, and in certain cases, particular locations of elements or sequence of method steps may be reversed or interposed, all without departing from the spirit or scope of the invention as defined in the appended Claims. The scope of the Claims of the invention should therefore be determined with reference to the description above and the appended Claims, along with their full range of equivalents.

What is claimed is:

1. A method for reliable high speed data transfer in multiple data rate nonvolatile memory, the method comprising:
    establishing a memory controller and a nonvolatile memory having a communication link therebetween;
    establishing a range of delay values representing relative delay between a plurality of data signals and a data strobe signal for data transmission from the memory controller to the nonvolatile memory through the communication link;
    selectively establishing a training portion in the nonvolatile memory defined based on a smallest erasable unit of the nonvolatile memory;
    providing at least one known data pattern;
    executing the memory controller to:
        sequentially write the known data pattern to different segments of the training portion of the nonvolatile memory, the known data pattern being written repetitively in the segments of the training portion and relative to the data strobe signal at different delay values within the established range for each written segment;
        sequentially read each of the segments to compare the data pattern read with the known data pattern and thereby identify each correctly written segment, a first of the correctly written segments defining a leading edge of alignment between data and data strobe signals, a last of the correctly written segments defining a trailing edge of alignment between data and data strobe signals; and
        establish an optimal delay value as a mean delay value between the delay values of the leading and trailing edge alignment, subsequent write operations to the nonvolatile memory being executed based on the optimal delay value.

2. The method as recited in claim 1, wherein the established range of delay values are a step-wise range of discrete values, each delay value of the established range being associated with a corresponding one of the segments of the training portion.

3. The method as recited in claim 1, wherein selectively establishing a training portion further includes evaluations of blocks being unused, blocks being free of bad sectors, and wear leveling requirements of the nonvolatile memory.

4. The method as recited in claim 1, wherein an individual optimal delay value is established for each of the plurality of data signals relative to the data strobe signal.

5. The method as recited in claim 1, further comprising:
    encoding the known data pattern with an error correcting code (ECC) before being written to the training portion, and
    using the ECC to restore bit errors of data read prior to comparison with the known data pattern.

6. The method as recited in claim 1, wherein the segments of the training portion are of equal memory capacity.

7. A method for reliable high speed data transfer in multiple data rate nonvolatile memory, the method comprising:
    establishing a memory controller and a nonvolatile memory having a communication link therebetween;
    establishing a range of delay values representing relative delay between a plurality of data signals and a data strobe signal for data transmission from the memory controller to the nonvolatile memory through the communication link;

selectively establishing a training portion in the nonvolatile memory;

providing a known data pattern;

writing the known data pattern into the training portion of the nonvolatile memory at a first data rate;

repetitively reading the stored data pattern from the training portion of the nonvolatile memory as a plurality of data signals in conjunction with a data strobe signal, each reading at a sequentially different delay value within the established range, the readings being at a second data rate greater than the first data rate;

sequentially comparing the data patterns read from the training portion with the known data pattern to identify each correct reading; and, responsive to the sequential comparisons, determining an optimum delay value that aligns rising and falling edges of the data strobe signal centrally between rising and falling edges of the data signals, subsequent read operations from the nonvolatile memory being executed at the second data rate based on the optimal delay value.

8. The method as recited in claim 7, wherein selectively establishing a training portion includes evaluations of blocks being unused, blocks being free of bad sectors, and wear leveling requirements of the nonvolatile memory.

9. The method as recited in claim 7, wherein the known data pattern is a pseudo-random sequence generated by a pseudo random pattern generator (PRPG).

10. The method as recited in claim 7, wherein the first data rate is a Single Data Rate (SDR) keyed once per clock cycle.

11. The method as recited in claim 10, wherein the second data rate is a Double Data Rate (DDR) keyed twice per clock cycle.

12. The method as recited in claim 7, further comprising:

encoding the known data pattern with an error correcting code (ECC) before writing to the training portion, and using the ECC to correct for bit-flips in data read from the training portion before comparing the read data pattern read with the known data pattern.

13. A system for reliable high speed data transfer in multiple data rate nonvolatile memory, the system comprising:

a memory controller including:
 a timing generator establishing a data strobe signal output during write operations,
 a plurality of delay circuits operable to selectively delay a received data strobe signal and a plurality of data signals output from the memory controller, and
 a training module; and a nonvolatile memory coupled to the memory controller by a data strobe signal line and a plurality of data signal lines for bidirectional transmission therebetween;

the training module of the memory controller being configured to:
 (a) establish a range of delay values for respective use with the plurality of delay circuits to selectively delay the data strobe signal relative to data signals during a read training process,
 (b) write a first known data pattern into a page of a training portion of the nonvolatile memory in a low speed mode,
 (c) repeatedly read the page in a high speed mode while sequentially incrementing a delay value within the established range for each successive read operation to thereby sweep a delay of the data strobe signal through at least a portion of the range of delay values,
 (d) compare the first known data pattern with data read during each successive read operation to identify each correct reading, a first of the correct readings defining a relative leading edge alignment, a last of the correct readings defining a relative trailing edge alignment, and
 (e) determine an optimum read delay value of the data strobe signal relative to the data signals as a mean delay value between delay values of the leading and trailing edge alignment, subsequent read operations to the nonvolatile memory being executed based on the optimal read delay value.

14. The system for reliable high speed data transfer in multiple data rate nonvolatile memory as recited in claim 13, where the training module is further configured to:

(f) repeatedly write a second known data pattern to sequential sectors of the training portion in a high speed mode while, for each write operation, sequentially incrementing a delay value and delaying, relative to the data strobe signal, the data signals providing the second known data pattern by the incremented delay value for each successive write operation, (g) sequentially read the sectors in a high speed mode at the optimum read delay value for the data strobe signal output from the nonvolatile memory, to thereby identify each sector correctly written with the second known data pattern, a first of the correctly written segments defining a relative leading edge alignment of the data signals with respect to the data strobe signal, a last of the correctly written segments defining a relative trailing edge alignment of the data signals with respect to the data strobe signal, and (h) determine an optimum write delay value of the data signals relative to the data strobe signal as a mean delay value between the delay values of the leading and trailing edge alignment, subsequent write operations to the nonvolatile memory being executed based on the optimal write delay value.

15. The system for reliable high speed data transfer in multiple data rate nonvolatile memory as recited in claim 14, where the second known data pattern and the first known data pattern are a same data pattern.

\* \* \* \* \*